(12) United States Patent
Richardson et al.

(10) Patent No.: US 10,689,775 B2
(45) Date of Patent: Jun. 23, 2020

(54) SOLUTION DEPOSITION METHOD FOR FORMING METAL OXIDE OR METAL HYDROXIDE LAYER

(71) Applicant: Seoul Semiconductor Co., Ltd., Ansan-si (KR)

(72) Inventors: Jacob J. Richardson, Goleta, CA (US); Evan C. O'Hara, Goleta, CA (US); Daniel Estrada, Goleta, CA (US)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 16/164,795

(22) Filed: Oct. 19, 2018

(65) Prior Publication Data

US 2019/0048488 A1 Feb. 14, 2019

Related U.S. Application Data

(63) Continuation of application No. 15/606,945, filed on May 26, 2017, now Pat. No. 10,106,909, which is a
(Continued)

(51) Int. Cl.
| | |
|---|---|
| *C23C 18/12* | (2006.01) |
| *C30B 7/04* | (2006.01) |
| *C30B 19/00* | (2006.01) |
| *C30B 29/16* | (2006.01) |
| *C25D 7/12* | (2006.01) |

(Continued)

(52) U.S. Cl.
CPC .............. *C30B 7/04* (2013.01); *C23C 18/125* (2013.01); *C23C 18/1216* (2013.01); *C23C 18/1245* (2013.01); *C23C 18/1283* (2013.01); *C23C 18/1651* (2013.01); *C25D 7/123* (2013.01); *C30B 7/00* (2013.01); *C30B 19/00* (2013.01); *C30B 29/10* (2013.01); *C30B 29/16* (2013.01); *H01L 21/02175* (2013.01);
(Continued)

(58) Field of Classification Search
CPC .. C30B 7/00; C30B 7/04; C30B 19/00; C30B 29/16; C23C 18/12; C23C 18/16
See application file for complete search history.

(56) References Cited

U.S. PATENT DOCUMENTS

| | | |
|---|---|---|
| 8,043,889 B1 | 10/2011 | Ulmer et al. |
| 8,268,287 B2 | 9/2012 | Ting et al. |

(Continued)

OTHER PUBLICATIONS

Jun, et al., "High-performance low-temperature solution-processable ZnO thin film transistors by microwave-assisted annealing", Journal of Materials Chemistry, vol. 21, No. 4, pp. 1102-1108 (2011).

(Continued)

*Primary Examiner* — Robert M Kunemund
(74) *Attorney, Agent, or Firm* — H.C. Park & Associates, PLC

(57) ABSTRACT

A solution deposition method includes: applying a liquid precursor solution to a substrate, the precursor solution including an oxide of a first metal, a hydroxide of the first metal, or a combination thereof, dissolved in an aqueous ammonia solution; evaporating the precursor solution to directly form a solid seed layer on the substrate, the seed layer including an oxide of the first metal, a hydroxide of the first metal, or a combination thereof, the seed layer being substantially free of organic compounds; and growing a bulk layer on the substrate, using the seed layer as a growth site or a nucleation site.

7 Claims, 3 Drawing Sheets

Related U.S. Application Data continuation of application No. 14/537,487, filed on Nov. 10, 2014, now Pat. No. 9,702,054.

(51) Int. Cl.
*H01L 21/02* (2006.01)
*C23C 18/16* (2006.01)
*C30B 7/00* (2006.01)
*C30B 29/10* (2006.01)

(52) U.S. Cl.
CPC .. *H01L 21/02282* (2013.01); *H01L 21/02293* (2013.01); *H01L 21/02304* (2013.01); *H01L 21/02307* (2013.01)

(56) References Cited

U.S. PATENT DOCUMENTS

| | | |
|---|---|---|
| 8,637,334 B2 | 1/2014 | Thompson et al. |
| 8,668,774 B2 | 3/2014 | Richardson et al. |
| 8,691,012 B2 | 4/2014 | Cha et al. |

OTHER PUBLICATIONS

Seong, et al., "Micro-patterned ZnO semiconductors for high performance thin film transistors via chemical imprinting with a PDMS stamp", Chem. Commun, vol. 49, No. 27, pp. 2783-2785 (Apr. 2013).

Richardson, et al.; "Controlling Low Temperature Aqueous Synthesis of ZnO", Crystal Growth & Design, vol. 9, No. 6, pp. 2570-2575 (2009).

Park, et al., "The Structural, optical and electrical characterization of high-performance, low-temperature and solution-processed alkali metal-doped ZnO TFTst", J. Mater, Chem. C, vol. 1, No. 7, pp. 1383-1391 (2013).

Jacob Joseph Richardson, "The Low Temperature Aqueous Synthesis of Epitaxial ZnO Films", Dissertation for Doctor of Philosophy in Materials, Univ. of Calif., Santa Barbara, pp. i-153 (May 2010).

Non-Final Office Action dated Oct. 7, 2016, in U.S. Appl. No. 14/537,487.

Notice of Allowance dated Mar. 1, 2017, in U.S. Appl. No. 14/537,487.

Non-Final Office Action dated Mar. 8, 2018, in U.S. Appl. No. 15/606,945.

Notice of Allowance dated Jun. 22, 2018, in U.S. Appl. No. 15/606,945.

SOLUTION DEPOSITION METHOD FOR FORMING METAL OXIDE OR METAL HYDROXIDE LAYER

CROSS-REFERENCE TO RELATED APPLICATIONS

This application is a Continuation of U.S. patent application Ser. No. 15/606,945, filed on May 26, 2017 now U.S. Pat. No. 10,106,909, which is a Continuation of U.S. patent application Ser. No. 14/537,487, filed on Nov. 10, 2014, issued as U.S. Pat. No. 9,702,054.

BACKGROUND

Field

Aspects of the present invention relate to a solution deposition method for forming a metal oxide or metal hydroxide layer.

Discussion of the Background

Metal oxide and metal hydroxide films are useful for a wide variety of applications and may be deposited by a number of different methods. In many of these cases, the deposition of a metal oxide or metal hydroxide film involves the use of a seed layer or nucleation layer, which is deposited or processed under different conditions or by a different method than the deposition of the bulk of the film. The purpose of a seed/nucleation layer may be to provide a uniform distribution and density of sites for additional material to be deposited during a subsequent growth process, and/or to create a different set of properties at the immediate interface with the substrate than those of the bulk of the film.

When synthesizing a new phase of matter on the surface of an existing phase, the new phase should nucleate before growing. Nucleation of a new phase has a higher energy barrier than continued growth of the new phase. As a result, some conditions that will result in growth on an existing seed layer may not be adequate for nucleation on an unseeded substrate of a different phase, and conditions necessary for nucleation on a substrate may lead to poor quality growth. Therefore, it is often beneficial to split the formation of a film into separate nucleation and growth steps. This has been shown to be especially useful for the growth of metal oxides and metal hydroxides from solution.

Metal oxides and metal hydroxide films can be synthesized by a number of solution-based growth methods including, hydrothermal and solvo-thermal growth, chemical bath deposition (CBD), successive ionic layer adsorption and reaction (SILAR), Electroless Deposition, etc. Solution growth methods have been used previously to synthesize a wide variety of films and Micro/Nano-Structures. In many of these cases, the deposition of a uniform film or array of nano/microstructures involves the use of a seed (nucleation) layer.

A seed layer provides a uniform distribution of sites for low-temperature solution growth. Without a seed layer, conditions used for solution deposition/growth typically lead to non-uniform and/or low density distribution of nucleation sites, which develop into a low density of spatially separated structures or "islands", rather than a desired uniform array or film. Several different methods have previously been explored for seed layer creation, including coating the substrate with a suspension of nanoparticles, coating with a metal-organic precursor film, which, upon heating, decomposes and crystallizes into a metal oxide, vapor deposition of a thin metal oxide layer, and aqueous deposition by initiating the rapid precipitation of a metal oxide from solution.

These techniques all have serious drawbacks, especially for the deposition of epitaxial films. The use of nanoparticle seeds deposited from suspension is not compatible with epitaxy as it typically creates a seed layer with random orientation. The same is true for related art metal-organic precursor film methods, unless very high temperatures are used to recrystallize the seed film. Vapor deposition is capable of producing epitaxial seed layers, but the use of such methods to produce the seed layer negates much of the potential cost or other processing advantages of using low temperature aqueous solution deposition for the subsequent bulk film growth.

Recently, thin films of ZnO and related materials have been demonstrated using a solution process where a precursor solution is prepared by the dissolution of zinc oxide or zinc hydroxide powder in aqueous ammonia. Films were prepared from this type of precursor solution by spin-coating and other coating or printing methods. In the prior art, the resulting ZnO films have been applied to the fabrication thin-film transistors, wherein the substrate for deposition is typically $SiO_2$ or glass. These ZnO films are polycrystalline or amorphous in nature, not epitaxial. A ZnO film deposited by this method forms an entire ZnO layer, and does not serve as a seed or nucleation layer for subsequent solution deposition.

SUMMARY OF THE INVENTION

According to various embodiments of the present invention, provided is a solution deposition method for forming a metal oxide or metal hydroxide nucleation layer.

Additional features of the invention will be set forth in the description which follows, and in part will be apparent from the description, or may be learned by practice of the invention.

An exemplary embodiment of the present invention provides a solution deposition method including: applying a liquid precursor solution to a substrate, the precursor solution comprising an oxide of a first metal, a hydroxide of the first metal, or a combination thereof, dissolved in an aqueous ammonia solution; evaporating the precursor solution to directly form a solid seed layer on the substrate, the seed layer comprising an oxide of the first metal, a hydroxide of the first metal, or a combination thereof, the seed layer being substantially free of organic compounds; and growing a bulk layer on the substrate, using the seed layer as a growth site or a nucleation site.

An exemplary embodiment of the present invention provides a solution deposition method including: applying a liquid precursor solution to a substrate, the precursor solution comprising an oxide of a first metal, a hydroxide of the first metal, or a combination thereof, dissolved in an aqueous ammonia solution; evaporating the precursor solution to directly form a solid seed layer on the substrate, the seed layer comprising an oxide of the first metal, a hydroxide of the first metal, or a combination thereof, the seed layer being substantially free of organic compounds; and growing a bulk layer a on the substrate, using the seed layer as a nucleation site, the bulk layer comprising an oxide of a second metal, a hydroxide of the second metal, or a combination thereof, the second metal being different from the first metal.

An exemplary embodiment of the present invention provides a method including applying a liquid precursor solution to a substrate, the precursor solution comprising an oxide of a first metal, a hydroxide of the first metal, or a combination thereof, dissolved in an aqueous ammonia solution; evaporating the precursor solution to directly form a solid seed layer on the substrate, the seed layer comprising an oxide of the first metal, a hydroxide of the first metal, or a combination thereof, the seed layer being substantially free of organic compounds; and growing a bulk layer on the substrate, using the seed layer as a growth site, the bulk layer comprising an oxide of the first metal, a hydroxide of the first metal, or a combination thereof.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
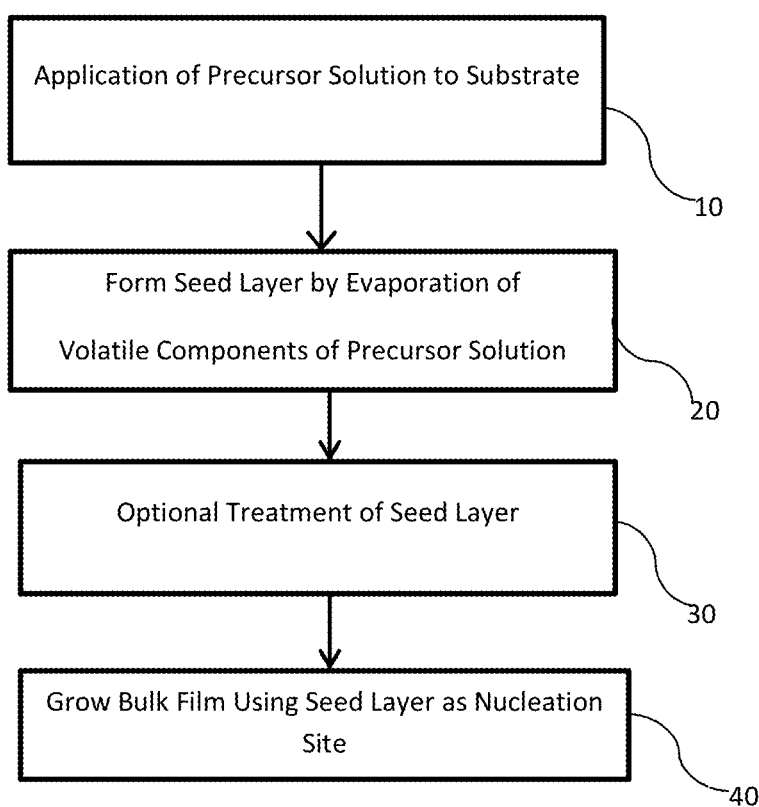
FIG. 1 illustrates block diagram illustrating a solution deposition method according to various embodiments of the present disclosure.

The invention is described more fully hereinafter with reference to the accompanying drawings, in which embodiments of the invention are shown. This invention is may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. For clarity, like numerals refer to like components.

The present disclosure pertains to the use of the method described herein to produce a thin metal oxide or hydroxide film on a substrate. The film may be a seed layer for the growth of a bulk metal oxide or metal hydroxide material layer, including the growth of a metal oxide or metal hydroxide bulk layer using a solution based method.

Herein, a "growth site" refers to a structure composed, at least in part, of a crystalline phase upon which crystal growth of that same phase occurs. For example, a "growth site" may operate as a seed for crystal growth. In addition, a "nucleation site" refers to a structure upon which a crystalline phase may nucleate and grow, but is not composed of the same crystalline phase as the material that nucleates and grows.

Figure 2:
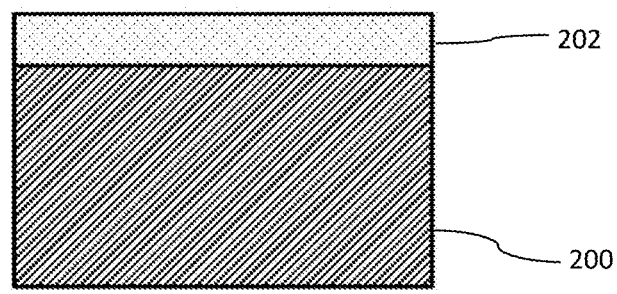
FIGS. 2-4 illustrate structures formed during the method of FIG. 1.
Figure 3:
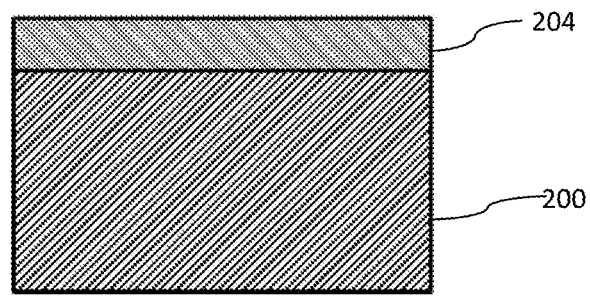
Figure 4:
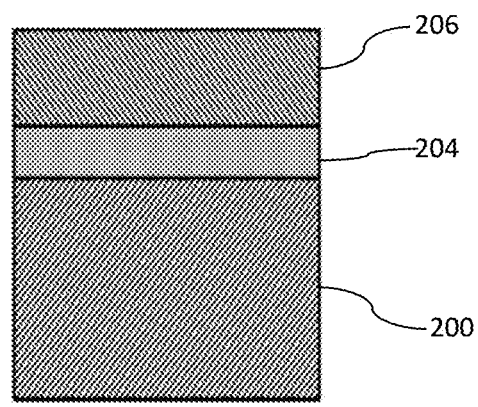

FIG. 1 is a block diagram illustrating a solution deposition method according to various embodiments of the present disclosure. FIGS. 2-4 illustrate structures formed during operations of the method. As shown in FIGS. 1 and 2, in operation 10, a precursor solution is applied to a substrate 200 to form a liquid film 202. The precursor solution may be applied using a method such as spin-coating, dip-coating, slot and die coating, spray-coating, roll coating, transfer stamping or printing, inkjet printing, etc. The precursor solution may be applied at room temperature.

Operation 10 may further include preparing the surface of the substrate 100 prior to the forming of the film 202. The surface may be prepared by washing, or another surface preparation method designed to remove any surface contamination, to create desired surface termination, or otherwise produce a surface conducive to film deposition.

The precursor solution may be formed dissolving a first compound in an aqueous solution including ammonia, such as 25-30 wt % $NH_3$ in $H_2O$. The first compound may include a metal oxide and/or a metal hydroxide. For example, the first compound may be selected from ZnO, $Zn(OH)_2$, NiO, $Ni(OH)_2$, CuO, and $Cu(OH)_2$.

When the first compound includes a zinc compound, the resulting solution may contain water and the resulting soluble species of Zn(II) and ammonia. The dominant soluble Zn(II) species include hydroxide and amine complexes of the respective forms, $Zn(OH)_x^{2-x}$ and $Zn(NH_3)_x^{2+}$, where x is an integer between 1 and 4. The amount of dissolved zinc can range from almost nothing up to the saturation limit in the solution, by controlling the amount of zinc oxide or zinc hydroxide powder dissolved.

For a precursor solution saturated with dissolved zinc oxide or zinc hydroxide, the precursor solution may be prepared, for example, by allowing an excess of zinc oxide or zinc hydroxide powder to equilibrate with an aqueous ammonia solution, and then separating the saturated aqueous ammonia solution from any undissolved zinc oxide or zinc hydroxide. The equilibration process may be accelerated by agitating the aqueous ammonia and zinc oxide or zinc hydroxide mixture, for example, by stirring, mixing, or shaking. The saturated aqueous ammonia solution may be separated from undissolved zinc oxide or zinc hydroxide powder by filtration, for example, by filtering the mixture through one or more porous membranes with pores small enough to prevent the passage of the zinc oxide or zinc hydroxide particles. The amount of zinc oxide powder dissolved in aqueous ammonia solution at saturation can be controlled by the composition of the aqueous ammonia solution, for example, the ammonia concentration of the solution, or controlled by the conditions under which the solution is saturated, for example, the temperature of the solution during saturation.

According to some embodiments, the precursor solution may include one or more additional solvents or additives that do not substantially react with the dissolved metal species and evaporate from the liquid precursor film, as described below, so as to not remain in significant quantities in the solid seed layer that is formed. For example, the solution may include common water miscible organic solvents including methanol, ethanol, isopropanol, n-propanol, and acetone.

According to some embodiments, the precursor solution may include additional dissolved elements, besides those of water, ammonia, and a pure metal oxide or metal hydroxide, which do not evaporate from the liquid precursor film, as described below, and are incorporated into the solid seed layer that is formed. The additional dissolved elements may include elements which act as dopants or alloy the composition of the seed layer metal oxide or metal hydroxide compound. For a zinc oxide seed layer, for example, the additional elements may include Li, Na, Be, Mg, Ti, Zr, Hf, Cr, Mo, W, Mn, Fe, Co, Ni, Cu, Cd, Al, Ga, In, Si, Ge, Sn, P, As, S, Se, and F.

As shown in FIGS. 1 and 3, once the liquid film 202 is formed, the volatile ammonia and $H_2O$, as well as any other volatile solvents or additives present in the liquid film 202, are actively or passively evaporated, leaving a solid seed layer 204 behind. The evaporation may occur at a liquid film temperature ranging from the freezing and boiling points of the liquid film. For example, according to some embodiments wherein the precursor solution is primarily composed of ammonia and H$_2$O, the liquid film may be evaporated at a temperature ranging from −75° C. to 100° C. This may be achieved, for example, by holding the ambient environment temperature, the substrate temperature, or both, at a temperature in this range. In some embodiments, the liquid film may be evaporated at a temperature near room temperature, e.g., ranging from 15° C. to 30° C., with or without any specific measures to control this temperature. Following the evaporation, the seed layer 204 may be free of organic compounds, or the seed layer 204 may be substantially free of organic compounds, i.e., the seed layer 204 may contain no more than a trace amount of organic compounds. In other words, the evaporation directly results in the formation of the inorganic seed layer 204, which does not include more than a trace amount of organic compounds. Therefore, a subsequent annealing process to remove such organic compounds from the seed layer 204 may be omitted. As a result, processing time, process complexity, and thermal damage to substrates, may be reduced, as compared with methods for forming inorganic seed layers wherein a solid precursor film containing organic compounds is first deposited and then converted to a fully inorganic seed layer by decomposing or otherwise removing the organic components. Herein, "organic compound" refers to any chemical compound containing a carbon atom bonded to another carbon or hydrogen atom.

The seed layer 204 may have a thickness of from about 2 nm to about 20 nm. The seed layer 204 may completely cover a surface of the substrate 200. In the alternative, the seed layer 204 may be patterned on the substrate 200, such that the seed layer covers only selected portions of the surface of the substrate. In this case, the seed layer may be used to template a pattern in the subsequent growth of the bulk layer 206, as described below, by promoting growth of the bulk layer only on the selected portions of the surface covered with seed layer.

When the first compound includes zinc oxide, the Wurtzite crystal structure of zinc oxide may be the thermodynamically stable phase for the residual solid, i.e., the seed layer 204. However, at the temperature of the evaporation in operation 20, the resulting solid may be kinetically limited from completely forming Wurtzite ZnO. When the seed layer 204 is not completely converted into the thermodynamically stable phase, the seed layer 204 may include trapped water and/or ammonia. The complete reactions to form ZnO from the soluble Zn(II) species may be exemplified by Reactions 1 and 2 below. However, intermediate phases such as Zn(OH)$_2$ may be formed in this process, and may remain in the seed layer, if the reactions are not taken to completion.

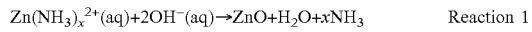

Reaction 1

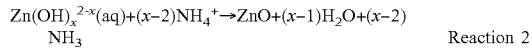

Reaction 2

As the H$_2$O and NH$_3$ in the liquid film 202 evaporate, the reactions are driven forward to produce solid ZnO of the seed layer 204.

It has been shown that ZnO can display retrograde solubility dependence on temperature in aqueous ammonia solutions. As the water, ammonia, and any other volatile components evaporate from the liquid film 202, and Reactions 1 and/or 2 progress, the remaining liquid may be cooled by the transfer of latent heat to the produced vapor. This cooling may produce increased solubility for ZnO in the remaining liquid. This may counteract the concentrating effect from evaporation, especially near the liquid-vapor interface. This may encourage nucleation and growth of ZnO at the solid-liquid interface, instead of the liquid-vapor interface, so that films grow from the substrate up, rather than by a precipitation and consolidation process occurring in the liquid film. By growing from the substrate up, it becomes possible for the ZnO to be deposited epitaxially, when the substrate 200 is suitably lattice matched.

Other metal oxides and metal hydroxides, for example the metal oxides and hydroxides of Cu(II) and Ni(II), form amine complexes similar to those of ZnO and have similar solubility behavior. Accordingly, the precursor solution may include such compounds to form seed layers including copper and nickel metal oxides or hydroxides.

As shown in FIG. 1, the seed layer 204 may be optionally processed in operation 30, in order to dehydrate, crystallize, and/or recrystallize the seed layer 204. The processing may produce a desired crystallinity, grain size, etc. The processing may change the electrical behavior of the interface between the seed layer 204 and the substrate 200. For example, the processing may convert an electrical contact between the seed layer 204 and the substrate 200 from a Schottky electrical contact to an Ohmic electrical contact. The processing of the seed layer 204 may increase the resistance of the seed layer 204 to dissolution during the formation of a bulk layer discussed below.

In some embodiments, the processing of the seed layer 204 in operation 30 may include a thermal treatment. The thermal treatment may occur at a higher temperature than that of the evaporation used to form the seed layer 204. For example, a thermal treatment at a temperature higher than that at which the seed layer 204 was evaporated may be applied to the seed layer 204. For example, the seed layer 204 may be heated to a temperature ranging from 100° C. to 600° C. In some embodiments, such a thermal treatment may further dehydrate the seed layer 204, convert zinc hydroxide in the seed layer into zinc oxide, crystallize an amorphous seed layer, or recrystallize a seed layer to have crystals of a different phase, size, shape, or orientation. As a result of such a thermal treatment there may be a change in the electrical behavior of the interface between the seed layer 204 and the substrate 200, or improved resistance of the seed layer to dissolution during the formation of a bulk layer, for example.

In some embodiments, the material of the seed layer 204 may have a crystal structure that allows for epitaxy on the crystal structure of the substrate 200. Accordingly, operation 30 may include treating the seed layer 204 under conditions that cause the seed layer 204 to crystallize or recrystallize with a preference for a specific crystal lattice orientation with respect to a crystal lattice of the substrate. For example, a ZnO seed layer may be deposited on a substrate comprising a single crystal or epitaxial layers of GaN, and/or other related materials having a Wurtzite crystal structure with similar lattice parameters. Following the evaporation of the water and ammonia in operation 20, the seed layer 204 may be thermally treated at elevated temperature in order to, first, further dehydrate the film and convert zinc hydroxide into ZnO, and second, to crystallize, or recrystallize, the resulting ZnO, so that it has a higher degree of crystal lattice orientation with respect to that of an underlying substrate. In some embodiments, a deposited ZnO film is on the order of 10 nm thick. The thin nature of the ZnO film allows for a low energy barrier for the atoms of the ZnO seed layer, to crystallize, or recrystallize, into a lattice that is oriented with respect to a crystal lattice of the substrate. As a result of this low energy barrier, the temperature required to crystallize or recrystallize the ZnO seed layer is less than would be required to crystallize or recrystallize a thicker layer.

As shown in FIGS. 1 and 4, in operation 40 a bulk layer 206 is deposited thereon. For purposes of illustration, FIG. 4 shows the seed layer 204 and the bulk layer 206 as being distinct layers. However, according to some embodiments, the seed layer 204 may be substantially indistinguishable from the bulk layer 206. The bulk layer 206 may be formed using a low-temperature deposition process, with the seed layer 204 providing nucleation sites or growth sites for the growth of the bulk layer 206. The bulk layer 206 may be formed by a solution deposition process selected from hydrothermal growth, solvo-thermal growth, chemical bath deposition, electrochemical deposition, electroless deposition, or successive ionic layer adsorption and reaction deposition (SILAR), for example.

According to some embodiments, the bulk layer 206 may include the same compound as the seed layer 204. For example, when the seed layer 204 includes an oxide of a first metal, a hydroxide of the first metal, or a combination thereof, the bulk layer 206 may include the same compound or compounds as the seed layer 204. For example, the seed layer 204 and the bulk layer 206 may include one or more of the same compounds selected from $ZnO$, $Zn(OH)_2$, $NiO$, $Ni(OH)_2$, $CuO$, and $Cu(OH)_2$. In this case, the seed layer 204 acts as a growth site for the crystal growth of the bulk layer 206.

For example, the seed layer 204 may include ZnO, and the bulk layer 206 may include additional ZnO deposited by a solution growth method resulting in a single ZnO layer. The solution growth method may include deposition by a reaction at the substrate 200 surface, involving dissolved ions in a surrounding solution. For example, the solution growth method may include chemical bath deposition (CBD), hydrothermal deposition, solvo-thermal deposition, electrochemical deposition, electroless deposition, or SILAR.

The crystal or crystals of the seed layer 204 provide energetically favorable sites for the deposition of ZnO from the bulk layer growth solution, so that the seed crystal or crystals grow larger. Because of the thin nature of the ZnO seed layer 204, the seed layer may be susceptible to dissolution during the bulk layer growth process when a solution growth method is used. The conditions for the growth on the seed layer 204 should be set such that the seed layer 204 is not completely dissolved by the growth solution before deposition of the bulk layer 206 on the seed layer 204 can occur. However, partial dissolution of the seed layer 204 may be desired as a means of controlling the crystal grain structure of the bulk layer 206.

According to some embodiments, the seed layer 204 and the bulk layer 206 may include different compounds. For example, when the seed layer 204 includes an oxide of a first metal, a hydroxide of the first metal, or a combination thereof, the bulk layer 206 may include an oxide of a second metal, a hydroxide of the second metal, or a combination thereof, with the second metal being different from the first metal. For example, the seed layer 204 and the bulk layer 206 may include different compounds selected from $ZnO$, $Zn(OH)_2$, $NiO$, $Ni(OH)_2$, $CuO$, and $Cu(OH)_2$. In this case, the seed layer 204 acts as a nucleation site for the growth of the bulk layer 206. However, the bulk layer 206 may be formed of any other suitable compound.

In an exemplary embodiment, the substrate 200 may be a group III-Nitride semiconductor based optoelectronic device wafer. The precursor solution used may include 25-30% aqueous ammonia and dissolved ZnO and/or $Zn(OH)_2$ powder, and no other intentionally incorporated components of significant concentration. Operation 10 and Operation 20 may include applying a liquid film of the precursor solution of the surface of the substrate 200, via spin coating, and then evaporating the same under ambient room temperature conditions. Operation 30 may include heating the seed layer at about 500° C. in a flowing $N_2$ atmosphere. In this embodiment, the treatment of Operation 30 makes the seed layer 204 more resistant to dissolution during the deposition of a bulk ZnO layer 206, via an aqueous solution growth method in Operation 40. The ZnO seed layer 204 and bulk layer 206 formed have an epitaxial relationship with the substrate 200 and together form a transparent contact layer for the group III-Nitride semiconductor based optoelectronic device. Other processing steps may be included either prior to operation 10, or subsequent to operation 40, in order to form a final optoelectronic device structure.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An optoelectronic device, comprising:
a substrate comprising epitaxial layers of a group III-Nitride semiconductor;
a seed layer formed on the substrate, the seed layer comprising an oxide of a first metal, a hydroxide of the first metal, or a combination thereof, and the seed layer being substantially free of organic compounds; and
a bulk layer formed on the seed layer,
wherein the bulk layer comprises an oxide of second metal, a hydroxide of the second metal, or a combination thereof, with the second metal being different from the first metal.

2. The optoelectronic device of claim 1, wherein the seed layer has a thickness of about 2 nm to about 20 nm.

3. The optoelectronic device of claim 1, wherein the seed layer covers only a selected portion of the surface of the substrate, and the bulk layer is disposed only on the selected portion.

4. The optoelectronic device of claim 1, wherein the seed layer is a ZnO seed layer and includes at least one additional element selected from the group of Li, Na, Be, Mg, Ti, Zr, Hf, Cr, Mo, W, Mn, Fe, Co, Ni, Cu, Cd, Al, Ga, In, Si, Ge, Sn, P, As, S, Se, and F.

5. The optoelectronic device of claim 1, wherein:
the seed layer is formed by applying a liquid precursor solution to the substrate, the precursor solution comprising the oxide of the first metal, the hydroxide of the first metal, or a combination thereof, dissolved in an aqueous ammonia solution;
evaporating the liquid precursor solution to directly form a solid seed layer, and
the bulk layer is grown on the substrate using the seed layer as a growth site or a nucleation site.

6. The optoelectronic device of claim 5, wherein the solid seed layer is processed by at least one of dehydrating, crystallizing, and recrystallizing the seed layer, and heating the seed layer at a temperature ranging from 100° C. to 600° C. before the bulk layer is grown.

7. The optoelectronic device of claim 6, wherein the precursor solution further comprises 25% to 30% aqueous ammonia and dissolved ZnO powder or dissolved Zn(OH)$_2$ powder.

* * * * *